United States Patent
Haynes

(10) Patent No.: US 9,728,326 B2
(45) Date of Patent: Aug. 8, 2017

(54) APPARATUS FOR EDDY CURRENT INHIBITING ELECTRO-MAGNETIC INTERFERENCE SHIELDING

(71) Applicant: THALES VISIONIX, INC., Clarksburg, MD (US)

(72) Inventor: Bill Haynes, Aurora, IL (US)

(73) Assignee: THALES VISIONIX, INC., Clarksburg, MD (US)

(*) Notice: Subject to any disclaimer, the term of this patent is extended or adjusted under 35 U.S.C. 154(b) by 0 days.

(21) Appl. No.: 14/519,812

(22) Filed: Oct. 21, 2014

(65) Prior Publication Data

US 2015/0107891 A1 Apr. 23, 2015

Related U.S. Application Data

(60) Provisional application No. 61/894,241, filed on Oct. 22, 2013.

(51) Int. Cl.
*H05K 9/00* (2006.01)
*H01F 27/36* (2006.01)
*H01F 27/34* (2006.01)

(52) U.S. Cl.
CPC ........... *H01F 27/362* (2013.01); *H05K 9/009* (2013.01); *H05K 9/0064* (2013.01); *H01F 2027/348* (2013.01)

(58) Field of Classification Search
CPC H05K 9/009; H05K 9/0064; H01F 2027/348; H01F 27/362
USPC ............................................................ 174/392
See application file for complete search history.

(56) References Cited

U.S. PATENT DOCUMENTS

| | | | | |
|---|---|---|---|---|
| 1,697,142 A | * | 1/1929 | Roller | H01F 1/143 139/425 R |
| 3,265,804 A | * | 8/1966 | Berger | F21V 5/00 174/389 |
| 5,360,941 A | * | 11/1994 | Roes | G06K 19/07327 174/378 |
| 7,288,494 B2 | * | 10/2007 | Iwasaki | H05K 9/0098 139/425 R |
| 7,339,120 B2 | * | 3/2008 | Notohara | H05K 9/009 174/357 |
| 8,680,406 B2 | * | 3/2014 | Chua | H05K 9/0088 174/392 |

(Continued)

*Primary Examiner* — Hung V Ngo
(74) *Attorney, Agent, or Firm* — Arent Fox LLP

(57) ABSTRACT

A non-eddy current electro-magnetic interference (EMI) shield to prevent or inhibit generation of eddy currents in the shield. The shield may include a non-conductive enclosure, one or more conductive traces interlaced on the non-conductive enclosure, wherein the one or more conductive traces do not form any conductive loops, and one or more ground connections on the one or more conductive traces, wherein the one or more ground connections do not form a ground loop. The EMI shielded electronic device may at least partially encompass an electronic device, such as a magnetic tracker, wherein the EMI shield comprises a non-conductive housing, with conductive traces interlaced on the housing, in a pattern or arrangement such that the conductive traces do not form any conductive loops. One or more ground connections may be provided for the one or more conductive traces.

6 Claims, 3 Drawing Sheets

(56) References Cited

U.S. PATENT DOCUMENTS

| | | | |
|---|---|---|---|
| 2005/0128038 A1* | 6/2005 | Hyvonen | H01F 17/0013 336/182 |
| 2010/0234081 A1* | 9/2010 | Wong | H01Q 1/243 455/575.5 |
| 2013/0056257 A1* | 3/2013 | Chua | H05K 9/0088 174/388 |
| 2017/0076857 A1* | 3/2017 | Huang | H01F 27/36 |

* cited by examiner

APPARATUS FOR EDDY CURRENT INHIBITING ELECTRO-MAGNETIC INTERFERENCE SHIELDING

CLAIM OF PRIORITY UNDER 35 U.S.C. §119

This application claims the benefit of and priority to U.S. Provisional Patent Application No. 61/894,241, titled "Apparatus for Eddy Current Inhibiting Electro-Magnetic Interference Shielding," filed Oct. 22, 2013, the disclosure of which is hereby incorporated in its entirety by reference herein.

BACKGROUND

Technical Field

Aspects of the present disclosure generally relate to electro-magnetic interference (EMI) shielding, and more particularly, to a method, apparatus, and system for providing EMI shielding that prevents or otherwise inhibits eddy current generation in the shielding.

Introduction

Generally, in order to provide EMI shielding for electronic devices and other items to be shielded from EMI, conductive materials such as copper, aluminum, and steel are used in electronic device enclosures. These enclosures are intended to shield the internal electronics from electromagnetic noise. However, such enclosures are not suitable for magnetic trackers (either static or dynamic), since any conductive material in or near the magnetic field of a magnetic tracker may distort the magnetic field of the magnetic tracker and result in inaccurate position measurements corresponding to the magnetic tracker. As such, magnetic trackers perform at their best when placed within or near enclosures that are made of non-conductive material only, such as air, glass, or wood.

At least some of such distortion of the magnetic field of the magnetic trackers within conventional EMI enclosures may be due to induced eddy currents. Eddy currents are currents induced in a conductive material when the conductive material is subjected to a changing magnetic field to which the conductive material is exposed. The intensity of the induced eddy currents is proportional to the strength of the applied magnetic field, the electrical conductivity of the conductive material, and the rate of change of the applied magnetic field. Also, the greater the surface area of the conductive material to form multiple current loops within the material, the greater the induced eddy currents.

Once induced by a magnetic field, the eddy currents thereby generated may themselves induce one or more magnetic fields. Therefore, when a magnetic tracker is placed within or near a conventional EMI shield or enclosure, and that enclosure is then subjected to a magnetic field, the eddy currents induced in the conventional EMI shield may result in distortion in the magnetic field measurements of the magnetic tracker, due to magnetic fields generated by the eddy currents. As a result of this distortion, the performance of the magnetic tracker may be diminished.

Accordingly, there exists an unmet need for improved EMI shielding of magnetic trackers.

SUMMARY

Aspects of the present invention provide for methods, devices, and systems for providing EMI shielding that prevents or inhibits generation of eddy currents in the shielding, for use, for example, with magnetic trackers and/or other devices sensitive to electromagnetic interference.

According to one aspect, an example electro-magnetic interference (EMI) shield for inhibiting generation of eddy currents in the shield, may include: a non-conductive housing configured to at least partially encompass a device protected from EMI; one or more conductive traces interlaced on the non-conductive enclosure, wherein the one or more conductive traces are formed so as not to contain any conductive circuit loops; and one or more ground connections connected to the one or more conductive traces.

According to one aspect, an electro-magnetic interference (EMI) shielded device may include: an electronic device; and an EMI shield at least partially encompassing the electronic device, wherein the EMI shield includes: a non-conductive enclosure at least partially encompassing the electronic device; one or more conductive traces interlaced on the non-conductive enclosure, the one or more conductive traces being configured to electro-magnetically shield the encompassed electronic device, wherein the one or more conductive traces are formed so as not to contain any closed conductive loops.

Additional advantages and novel features relating to aspects of the present invention will be set forth in part in the description that follows, and in part will become more apparent to those skilled in the art upon examination of the following or upon learning by practice thereof.

BRIEF DESCRIPTION OF THE DRAWINGS

Various features in accordance with aspects of the present invention will be described in the detailed description and the appended claims that follow, and in the accompanying drawings, wherein:

Figure 1:
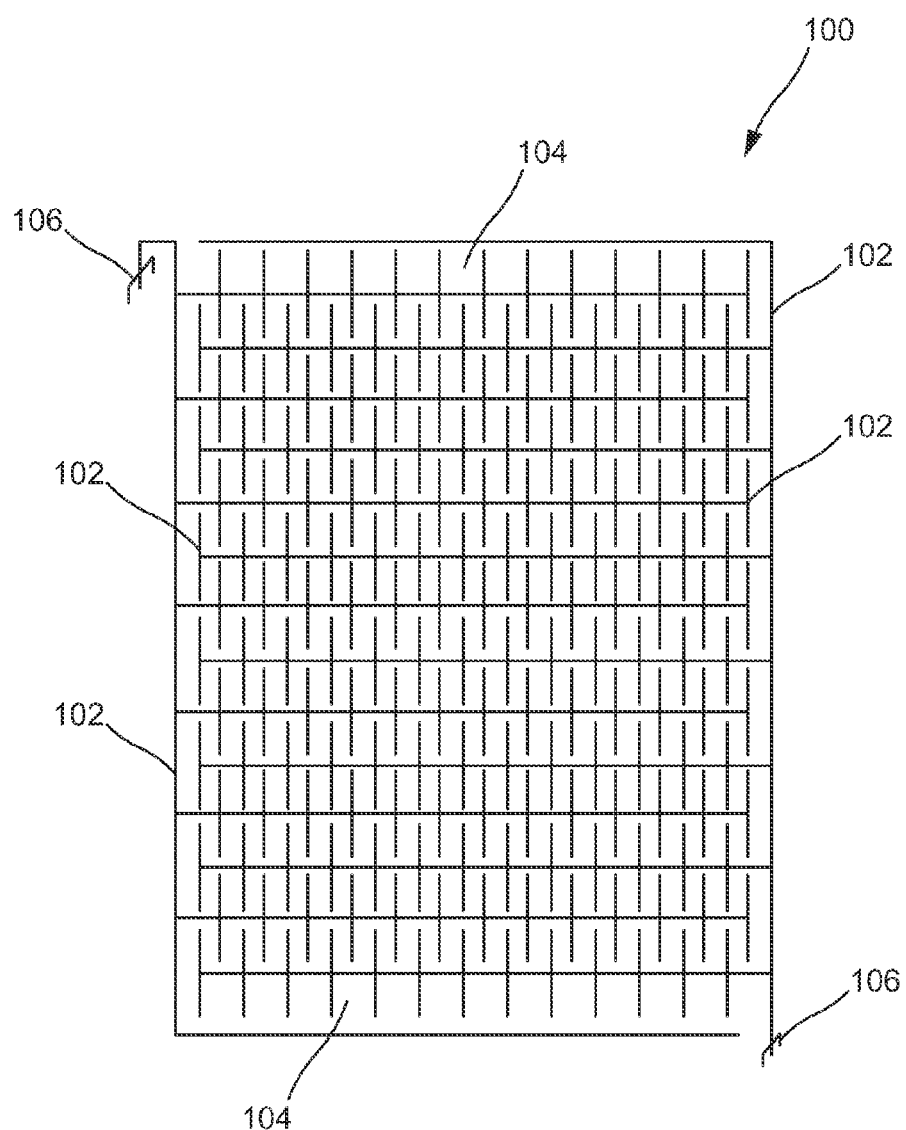
FIG. 1 illustrates an example non-eddy current EMI shield for electronic devices such as magnetic trackers, in accordance with aspects of the present disclosure.

In accordance with common practice, the various example features illustrated in the drawings may be simplified for clarity. Thus, the drawings may not depict all of the components of a given apparatus or method. In addition, like reference numerals may be used to denote like features throughout the specification and figures.

DETAILED DESCRIPTION

Various aspects of the present disclosure are described below. It should be apparent that the teachings herein may be encompassed in a wide variety of forms and that any specific structure, function, or both being disclosed herein may be merely representative. Based on the teachings herein, one skilled in the art should appreciate that an aspect disclosed herein may be implemented independently of any other aspects and that two or more of these aspects may be combined. For example, an apparatus may be implemented or a method may be practiced using any number of the aspects set forth herein. In addition, such an apparatus may be implemented or such a method may be practiced using other structure, functionality, or structure and functionality suitable for such purposes, in addition to or other than one or more example features as specifically set forth herein. An aspect may comprise one or more elements of a claim.

Various aspects of the present disclosure solve the above-identified needs, as well as others, via devices, methods, and systems capable of providing EMI shielding for electronic devices, such as magnetic trackers, that prevents or inhibits the generation of eddy currents in the shielding.

According to various aspects of the present disclosure, EMI shielding is provided by collapsing the conductive material of the EMI shield into a substantially one dimensional line, thereby preventing the formation of a conductive surface or current loop, and thus preventing the generation of eddy currents and any resulting distortions in the magnetic field of an enclosed electronic device, such as a magnetic tracker.

FIG. 1 illustrates a representative figure for an eddy current inhibiting EMI shield 100, in accordance with aspects of the present disclosure. As shown in FIG. 1, the EMI shield 100 is provided by implementing interlaced thin copper traces 102 on non-conductive material 104 (e.g., plastic). The interlaced shield 100 is formed such that it does not contain any closed current loops (or ground loops) and/or other features (e.g., planar or other extending conductive surfaces) otherwise conducive to generating eddy currents, when subjected to a magnetic field. Specifically, following any of the trace lines from any point on the trace leads ultimately only to an end point, without forming any circuit loop in the trace, thereby preventing or inhibiting the formation of eddy currents in the trace. The overlapping vertical traces 102 shown in FIG. 1 may provide excellent EMI attenuation well beyond the frequency spectrum of the internal electronics. In some aspects, this shielding is provided with a single or multiple point ground connections 106 as shown in FIG. 1. For example, the ends may be connected to a ground of the electronic device.

Although shown in a specific trace and intersecting line pattern in FIG. 1, the pattern shown is merely an example, and other suitable trace patterns may likewise be used, including, for example, a series of overlapping, but not intersection rows of sinusoidal patterns and/or other patterns.

Figure 3:
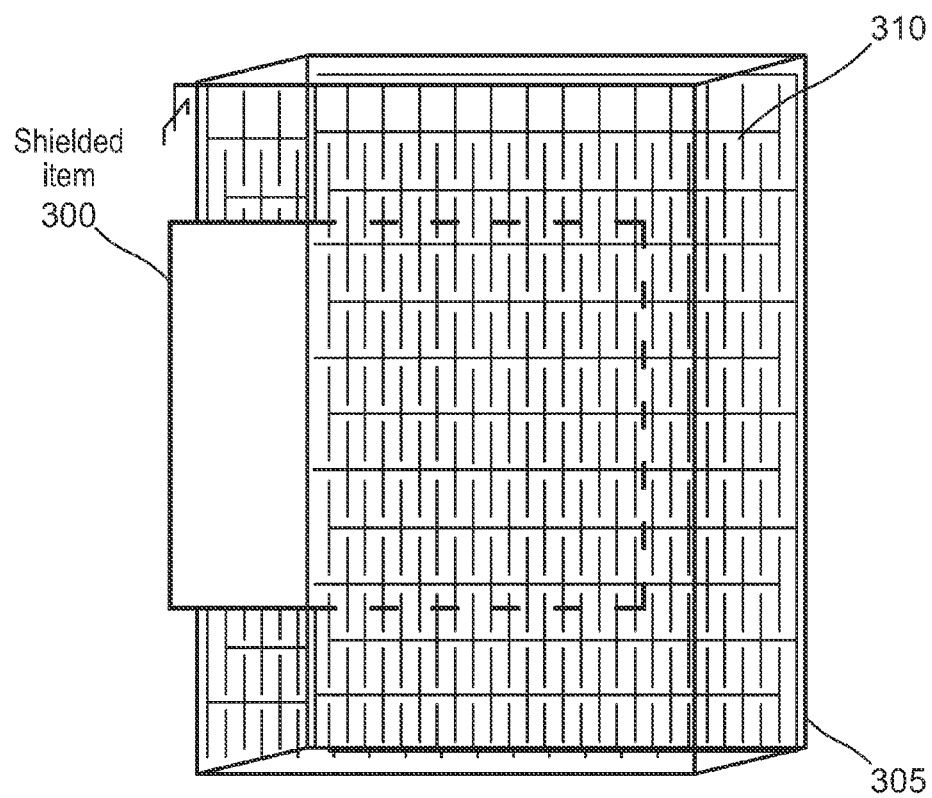
FIG. 3 shows a representative view of an example device encompassed within a shield that inhibits the generation of eddy currents in the shield, in accordance with aspects of the present invention.

The shield 100 may be encompassed in a housing or other features that surround, enclose, or otherwise at least partially encompass a device or other item to be protected from EMI, as further shown, for example, in FIG. 3.

Figure 2:
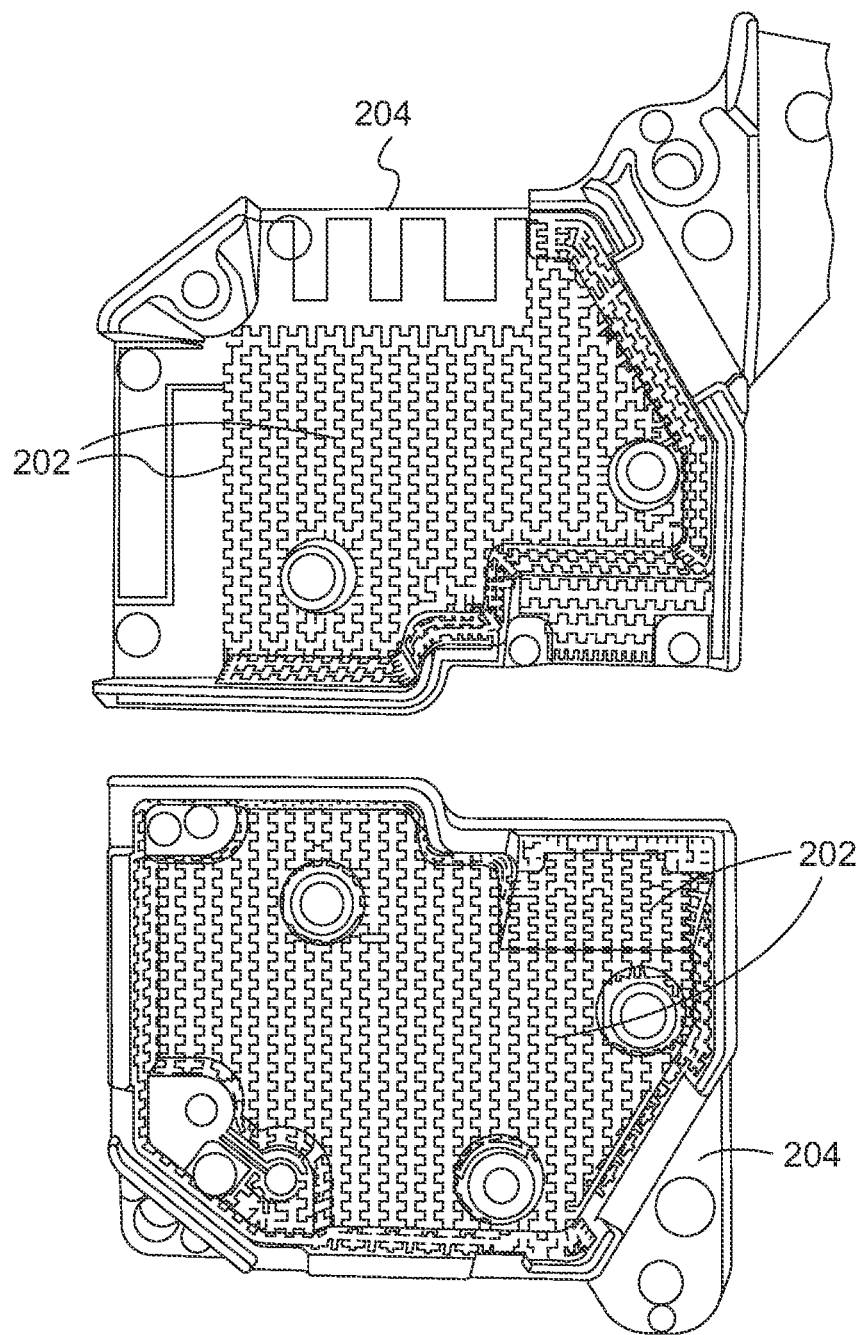
FIG. 2 illustrates an example device for enabling performance of a process to form an EMI shield for use with electronic devices, such as magnetic trackers, that inhibits eddy current generation, in accordance with aspects of the present invention.

FIG. 2 illustrates an example device for enabling performance of a process to form an EMI shield for use with electronic devices, such as magnetic trackers, that inhibits eddy current generation, in accordance with aspects of the present invention. The example technology utilized by the device 200 of FIG. 2, known as "SelectConnect LDS," is provided by SelectConnect Technologies of Palentine, Ill., may include use of laser structuring and electroless metallization to create metallic circuits and traces 202 on molded thermoplastic components 204. This technology may be used for electro-mechanical applications. Electroless plating refers to non-electrical plating of metals and plastics. SelectConnect technology allows copper traces 202 (with, e.g., nickel-gold plating) as thin as, for example, 0.005 inches to be plated on the inside surfaces of a 3D plastic material molded thermoplastic components 204 to provide an enclosure for an electronic device. Accordingly, in some aspects, SelectConnect technology permits an EMI shield (e.g., shield 100 of FIG. 1) to be implemented on the entire inside surface of an enclosure of an electronic device, such as a magnetic tracker. As a result, an EMI shield comparable to a metal enclosure is provided that is, at the same time, transparent to magnetic fields, e.g., does not distort the magnetic field of the enclosed electronic device, while preventing or inhibiting the formation of eddy currents in the shield.

FIG. 3 shows a representative view of an example device (e.g., magnetic tracker or other device sensitive to EMI) encompassed within a shield that inhibits the generation of eddy currents in the shield, in accordance with aspects of the present invention. As shown in FIG. 3, the example device to be shielded 300 is at least partially encompassed within a casing, housing, or other encompassing mechanism 305 that is formed of or has thereupon a shielding having conductive traces or other features 310 to provide EMI shielding, the traces or other features being formed, for example, in a tracing pattern that at least partially encompasses the shielded item 300.

While aspects of the present disclosure have been described in connection with preferred implementations, it will be understood by those skilled in the art that variations and modifications described above may be made without departing from the scope hereof. Other aspects will be apparent to those skilled in the art from a consideration of the specification or from a practice of the aspects of the invention disclosed herein.

The invention claimed is:

1. An electro-magnetic interference (EMI) shield configured to inhibit generation of eddy currents in the shield, the shield comprising:
    a non-conductive enclosure for at least partially encompassing a device protected from EMI;
    a first set of conductive traces interlaced with a second set of conductive traces on the non-conductive enclosure, wherein:
        the first set of conductive traces is oriented perpendicular with respect to the second set of conductive traces,
        each conductive trace in the first set of conductive traces intersects with only one conductive trace in the second set of conductive traces,
        each conductive trace in the first set of conductive traces terminates at a first end point and each conductive trace in the second set of conductive traces terminates at a second end point,
        the first set of conductive traces and the second set of conductive traces are formed so as not to contain any conductive circuit loops, and
        at least one of the first set of conductive traces and the second set of conductive traces extend on at least two different sides of the non-conductive enclosure; and
    one or more ground connections connected to the first end point associated with the first set of conductive traces and the second end point associated with the second set of conductive traces, wherein the one or more ground connections are connected so as to prevent formation of any current loops.

2. An electro-magnetic interference (EMI) shielded device, comprising:
    an electronic device; and
    an EMI shield at least partially encompassing the electronic device, wherein the EMI shield includes:
        a non-conductive enclosure at least partially encompassing the electronic device;
        a first set of conductive traces interlaced with a second set of conductive traces on the non-conductive enclosure, the first set of conductive traces and the second set of conductive traces being configured to electro-magnetically shield the encompassed electronic device, wherein:

the first set of conductive traces is oriented perpendicular with respect to the second set of conductive traces, each conductive trace in the first set of conductive traces intersects with only one conductive trace in the second set of conductive traces, each conductive trace in the first set of conductive traces terminates at a first end point and each conductive trace in the second set of conductive traces terminates at a second end point, the first set of conductive traces and the second set of conductive traces are formed so as not to contain any closed conductive loops, and at least one of the first set of conductive traces and the second set of conductive traces extend on at least two different sides of the non-conductive enclosure; and one or more ground connections connected to the first end point associated with the first set of conductive traces and the second end point associated with the second set of conductive traces, wherein the one or more ground connections do not form a current loop.

3. The EMI shielded device of claim 2, wherein the electronic device is a magnetic tracker.

4. An electro-magnetic interference (EMI) shield configured to inhibit generation of eddy currents in the shield, the shield comprising:

a non-conductive enclosure for at least partially encompassing a device protected from EMI;

a first set of non-linear conductive traces and a second set of non-linear conductive traces formed in overlapping rows on an interior surface of the non-conductive enclosure, wherein each conductive trace in the first set of non-linear conductive traces terminates at a first end point and each conductive trace in the second set of non-linear conductive traces terminates at a second end point, and wherein the first set of non-linear conductive traces and the second set of non-linear conductive traces are formed so as not to contain any conductive circuit loops; and one or more ground connections connected to the first end point associated with the first set of conductive traces and the second end point associated with the second set of conductive traces, wherein the one or more ground connections do not form a current loop.

5. The shield of claim 4, wherein the overlapping rows are non-intersecting.

6. The shield of claim 5, wherein the first set of non-linear conductive traces and the second set of non-linear conductive traces form a sinusoidal pattern.

* * * * *